United States Patent
Zheng et al.

(10) Patent No.: US 11,374,061 B2
(45) Date of Patent: Jun. 28, 2022

(54) OLED DISPLAY PANEL AND INTELLIGENT TERMINAL

(71) Applicant: WUHAN CHINA STAR OPTOELECTRONICS SEMICONDUCTOR DISPLAY TECHNOLOGY CO., LTD., Hubei (CN)

(72) Inventors: Min Zheng, Hubei (CN); Hong Gao, Hubei (CN); Mugyeom Kim, Hubei (CN); Yong Zhao, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 438 days.

(21) Appl. No.: 16/477,364

(22) PCT Filed: Apr. 18, 2019

(86) PCT No.: PCT/CN2019/083146
§ 371 (c)(1),
(2) Date: Jul. 11, 2019

(87) PCT Pub. No.: WO2020/133821
PCT Pub. Date: Jul. 2, 2020

(65) Prior Publication Data
US 2021/0359031 A1    Nov. 18, 2021

(30) Foreign Application Priority Data

Dec. 29, 2018  (CN) .......................... 201811643263.9

(51) Int. Cl.
*H01L 27/32*    (2006.01)

(52) U.S. Cl.
CPC ...... *H01L 27/3218* (2013.01); *H01L 27/3216* (2013.01); *H01L 27/3234* (2013.01)

(58) Field of Classification Search
CPC ............ H01L 27/3218; H01L 27/3216; H01L 27/3234; H01L 27/14603; H01L 27/14605;
(Continued)

(56) References Cited

U.S. PATENT DOCUMENTS 10,685,202 B2 *  6/2020  Kim ..................... G02B 6/0088
2009/0102855 A1  4/2009  Brown Elliott et al.
(Continued)

FOREIGN PATENT DOCUMENTS

CN    101636676 A    1/2010
CN    104183624 A    12/2014
(Continued)

*Primary Examiner* — Eduardo A Rodela

(57) ABSTRACT

The present invention provides an organic light emitting diode (OLED) display panel and an intelligent terminal, including: an electronic element region in which sensor elements are disposed; and a pixel region provided with at least one light transmissive region. The electronic element region is arranged corresponding to the at least one light transmissive region, multiple sub-pixels are arranged in the pixel region. Pixel density of the sub-pixels is gradually decreased along a direction toward a center of the pixel region.

16 Claims, 5 Drawing Sheets

(58) Field of Classification Search
CPC .......... H01L 27/14607; H01L 27/3206; H01L 27/3211; H01L 27/3225; H01L 27/3227; H01L 27/326; H01L 27/32
See application file for complete search history.

(56) References Cited

U.S. PATENT DOCUMENTS

| | | | |
|---|---|---|---|
| 2013/0176318 A1 | 7/2013 | Dunn et al. | |
| 2016/0293894 A1 | 10/2016 | Cheng et al. | |
| 2017/0263895 A1* | 9/2017 | Lee | H01L 27/3262 |
| 2018/0089491 A1* | 3/2018 | Kim | G06F 3/0412 |
| 2018/0113566 A1* | 4/2018 | Shigemori | G06F 3/04186 |
| 2019/0326366 A1* | 10/2019 | Fan | H01L 27/3218 |
| 2020/0212127 A1* | 7/2020 | Choi | H01L 51/0097 |
| 2020/0312832 A1* | 10/2020 | Chi | H01L 27/3218 |

FOREIGN PATENT DOCUMENTS

| | | | | |
|---|---|---|---|---|
| CN | 107819023 A | | 3/2018 | |
| CN | 107886850 A | | 4/2018 | |
| CN | 108881531 A | | 11/2018 | |
| KR | 2020082971 A | * | 12/2018 | ............. H01L 27/32 |
| TW | 201839745 A | | 11/2018 | |

\* cited by examiner

OLED DISPLAY PANEL AND INTELLIGENT TERMINAL

1. FIELD OF DISCLOSURE

The present invention relates to a field of display devices and in particular, to an organic light emitting diode (OLED) display panel and an intelligent terminal.

2. DESCRIPTION OF RELATED ART

At present, there is a trend of full screens for display screens of mobile phones on the market. Full screen display screens on the market include, for example, a notch display screen and a waterdrop display screen. As a result, a cutting area of a non-display region of a display screen is gradually reduced. In order to further reduce the cutting area, a hole is drilled in a pixel region, and sensor elements are placed under the display screen and arranged corresponding to the hole. In order to reserve an area for forming the hole in the pixel region, at least one sub-pixel of the pixel region needs to be removed, or an area of at least one sub-pixel has to be reduced, resulting in a difference in a number or a size of the sub-pixels between the pixel region and the display region, thereby resulting in a difference in pixel density between the pixel region and the display region, which in turn causes a significant difference in luminous efficiency between the pixel region and the display region.

SUMMARY

The present invention provides an organic light emitting diode (OLED) display panel and an intelligent terminal, so as to solve an existing problem of a great difference in luminous efficiency between a pixel region and a display region in conventional display panels.

The present invention provides an organic light emitting diode (OLED) display panel. The OLED display panel comprising:

an electronic element region in which a plurality of sensor elements are disposed; and a pixel region provided with at least one light transmissive region, the electronic element region being arranged corresponding to the at least one light transmissive region, a plurality of sub-pixels being arranged in the pixel region, pixel density of the sub-pixels being gradually decreased along a direction toward a center of the pixel region.

According to one embodiment, an area of the sub-pixels is gradually reduced along the direction toward the center of the pixel region, so that the pixel density of the sub-pixels is gradually decreased.

According to one embodiment, a pixel gap is defined between each two adjacent sub-pixels, and the at least one light transmissive region is defined in the pixel gaps, and wherein along the direction toward the center of the pixel region, a size of the pixel gaps is gradually increased, and a number and an area of the at least one light transmissive region are gradually increased.

According to one embodiment, a number of the sub-pixels is gradually decreased along the direction toward the center of the pixel region, so that the pixel density of the sub-pixels is gradually decreased.

According to one embodiment, the pixel region is further provided with at least one sub-pixel region, and the at least one light transmissive region is defined in the at least one sub-pixel region, and wherein along the direction toward the center of the pixel region, a number of the at least one sub-pixel region is gradually increased, and a number of the at least one light transmissive region is gradually increased.

According to one embodiment, an area and a number of the sub-pixels are alternately decreased along the direction toward the center of the pixel region, so that the pixel density of the sub-pixels is gradually decreased.

According to one embodiment, the pixel region is divided into at least one first region and at least one second region, wherein along the direction toward the center of the pixel region, the at least one first region and the at least one second region are alternately disposed, an area of the sub-pixels in the at least one first region is gradually decreased, and a number of the sub-pixels in the at least one second region is gradually decreased.

According to one embodiment, a pixel gap is defined between each two adjacent sub-pixels in the at least one first region, and the at least one light transmissive region is defined in the pixel gaps, and wherein along the direction toward the center of the pixel region, a size of the pixel gaps in the at least one first region is gradually increased, and a number and an area of the at least one light transmissive region in the at least one first region are gradually increased.

According to one embodiment, the at least one second region is provided with at least one sub-pixel region, and the at least one light transmissive region in the at least one second region is defined in the at least one sub-pixel region, and wherein along the direction toward the center of the pixel region, a number of the at least one sub-pixel region in the at least one second region is gradually increased, and a number of the at least one light transmissive region is gradually increased.

According to one embodiment, the OLED display panel further comprises a display region disposed outside the pixel region, a plurality of sub-pixels are arranged in the display region, and pixel density of the sub-pixels in the display region is greater than the pixel density of the sub-pixels in the pixel region.

The present invention further provides an intelligent terminal, comprising a plurality of sensor elements and an organic light emitting diode (OLED) display panel, the OLED display panel comprising:

an electronic element region; and a pixel region comprising at least one light transmissive region, the electronic element region being arranged corresponding to the at least one light transmissive region, the sensor elements being disposed in the electronic element region, a plurality of sub-pixels being arranged in the pixel region, pixel density of the sub-pixels being gradually decreased along a direction toward a center of the pixel region.

According to one embodiment, an area of the sub-pixels is gradually reduced along the direction toward the center of the pixel region, so that the pixel density of the sub-pixels is gradually decreased.

According to one embodiment, a pixel gap is defined between each two adjacent sub-pixels, and the at least one light transmissive region is defined in the pixel gaps, and wherein along the direction toward the center of the pixel region, a size of the pixel gaps is gradually increased, and a number and an area of the at least one light transmissive region are gradually increased.

According to one embodiment, a number of the sub-pixels is gradually decreased along the direction toward the center of the pixel region, so that the pixel density of the sub-pixels is gradually decreased.

According to one embodiment, the pixel region is further provided with at least one sub-pixel region, and the at least one light transmissive region is defined in the at least one sub-pixel region, and wherein along the direction toward the center of the pixel region, a number of the at least one sub-pixel region is gradually increased, and a number of the at least one light transmissive region is gradually increased.

According to one embodiment, an area and a number of the sub-pixels are alternately decreased along the direction toward the center of the pixel region, so that the pixel density of the sub-pixels is gradually decreased.

According to one embodiment, the pixel region is divided into at least one first region and at least one second region, wherein along the direction toward the center of the pixel region, the at least one first region and the at least one second region are alternately disposed, an area of the sub-pixels in the at least one first region is gradually decreased, and a number of the sub-pixels in the at least one second region are gradually decreased.

According to one embodiment, a pixel gap is defined between each two adjacent sub-pixels in the at least one first region, and the at least one light transmissive region in the at least one first region is defined in the pixel gaps, and wherein along the direction toward the center of the pixel region, a size of the pixel gaps in the at least one first region is gradually increased, and a number and an area of the at least one light transmissive region in the at least one first region are gradually increased.

According to one embodiment, the at least one second region is provided with at least one sub-pixel region, and the at least one light transmissive region in the at least one second region is defined in the at least one sub-pixel region, and wherein along the direction toward the center of the pixel region, a number of the at least one sub-pixel region in the at least one second region is gradually increased, and a number of the at least one light transmissive region is gradually increased.

According to one embodiment, the OLED display panel further comprises a display region disposed outside the pixel region, a plurality of sub-pixels are arranged in the display region, and pixel density of the sub-pixels in the display region is greater than the pixel density of the sub-pixels in the pixel region.

Advantages of the present invention: After the at least one light transmissive region is disposed in the pixel region, the pixel density of the sub-pixels arranged in the pixel region is gradually decreased along the direction toward the center of the pixel region, thereby avoiding a sudden change in the pixel density of the pixel region, and preventing a large difference in luminous efficiency between the pixel region and the display region, thus reducing a visual difference between the pixel region and the display region.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

Figure 1:
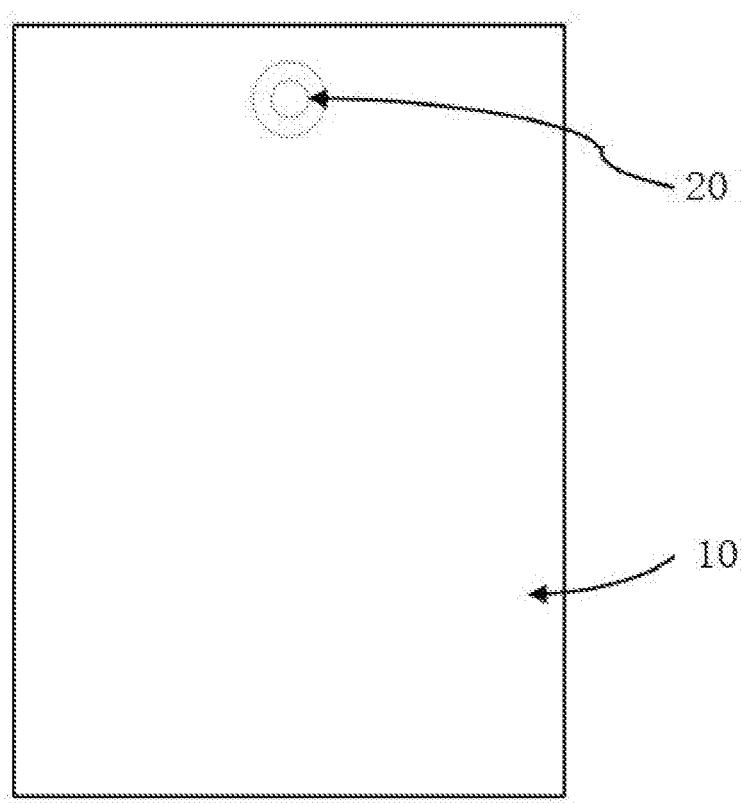
FIG. 1 is a schematic structural view illustrating an organic light emitting diode (OLED) display panel according to one embodiment of the present invention.

Preferable embodiments of the present invention are described below with reference to the accompanying drawings, which are used to exemplify the embodiments of the present invention and can fully describe technical contents of the present invention to make the technical contents of the present invention clearer and easier to understand. However, the present invention may be embodied in many alternative embodiments, and the scope of the present invention is not limited to the embodiments set forth herein.

The terms used in the description of the present invention are intended to describe specific embodiments but are not intended to illustrate the concept of the invention. Expressions in a singular form encompass plural forms of the expressions unless otherwise clearly specified in the context. In the specification of the present invention, it is to be understood that terms such as "comprise", "include", "contain" are intended to mean there are one or more elements, numbers, steps, actions, or combinations thereof. The same reference numerals in the drawings denote the same parts.

Figure 2:
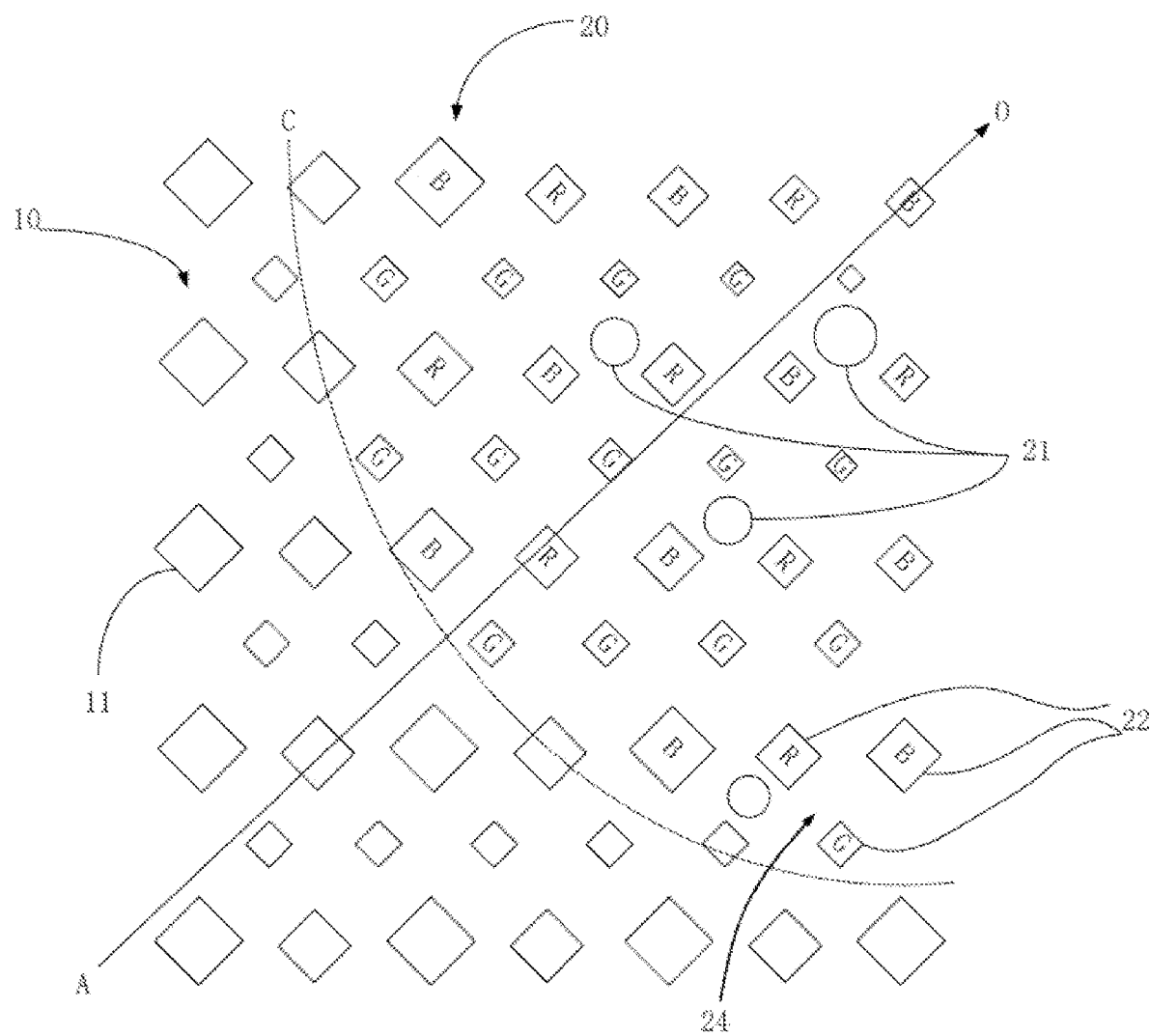
FIG. 2 is a schematic view illustrating distribution of a pixel region and a display region in the OLED display panel according to one embodiment of the present invention.

Please refer to FIG. 1. An organic light emitting diode (OLED) display panel comprises a display region 10 and a pixel region 20 (i.e., an O-cut region). The pixel region 20 may be a circular region or a region of a different shape. Referring to FIG. 2, on a left side of a boundary line C is the display region 10, and on a right side of the boundary line C is the pixel region 20.

On a bottom of the OLED display panel is provided with an electronic element region (not shown) for placing a plurality of sensor elements, such as sensor units of a camera. The electronic element region is arranged corresponding to the pixel region 20. At least one light transmissive region 21 is disposed in the pixel region 20. The electronic element region is arranged corresponding to the at least one light transmissive region 21, thus improving light transmission to the electronic element region, so that the sensor elements can be disposed in the electronic element region, and thereby a screen ratio is increased. It should be noted that the light transmissive region 21 may be a through hole filled with a transparent material, and the transparent material may be siloxane or a colorless polyimide (CPI).

Moreover, a plurality of sub-pixels 11 are arranged in the display region 10, and a plurality of sub-pixels 22 are arranged in the pixel region 20. The sub-pixels 11 and the sub-pixels 22 both include a blue sub-pixel B, a red sub-pixel R, and a green sub-pixel G Pixel density of the sub-pixels 22 are gradually decreased along a direction toward a center of the pixel region 20. It should be noted that although the pixel density of the pixel region 20 is changing, overall illumination provided by the pixel region 20 remains unchanged, and the overall illumination of the pixel region 20 can be maintained unchanged by increasing illumination intensity of the sub-pixels 22.

As shown in FIG. 2, a position O is taken as a center position of the pixel region 20, and the direction from the boundary line C toward the position O is a direction A toward the center of the pixel region 20. In the direction A, the pixel density of the sub-pixels 22 changes gradually. To be specific, the closer to the position O, the less the pixel density of the sub-pixels 22 is, and the closer to the boundary line C, the greater the pixel density of the sub-pixels 22 is. In addition, pixel density of the sub-pixels 11 of the display region 10 is greater than the pixel density of the sub-pixels 22 of the pixel region 20. In the present embodiment, the pixel density of the sub-pixels 22 of the pixel region 20 changes gradually, which can avoid a problem of a large difference in the luminous efficiency between the pixel region 20 and the display region 10 due to a sudden change of the pixel density of the pixel region 20, thereby reducing a visual difference between the pixel region 20 and the display region 10.

In one embodiment, as shown in FIG. 2, in the direction A toward the center of the pixel region 20, a number of the sub-pixels 22 remains unchanged, but an area of the sub-pixels 22 is gradually decreased, so that the pixel density of the sub-pixels 22 is gradually reduced. Specifically, in the direction A, an area of the sub-pixels of the same color gradually decreases. For example, an area of the blue sub-pixels B near the position O is smaller than the area of the blue sub-pixels B near the boundary line C. An area of the red sub-pixels R near the position O is smaller than the area of the red sub-pixels R near the boundary line C. An area of the green sub-pixels G near the position O is smaller than the area of the green sub-pixels G near the boundary line C.

Furthermore, as shown in FIG. 2, a pixel gap is defined between each two adjacent sub-pixels 22, and the at least one light transmissive region 21 is defined in the pixel gaps. In the direction A toward the center of the pixel region 20, a size of the pixel gaps gradually increases, and a number and an area of the at least one light transmissive region 21 gradually increases. Specifically, in the direction A, the number of the sub-pixels 22 remains unchanged, and the area of the sub-pixels 22 gradually decreases, thereby causing the pixel gap between each two adjacent sub-pixels 22 to gradually increase, and the at least one light transmissive region 21 is defined in suitable pixel gaps, so that the number and area of the at least one light transmissive regions 21 also change gradually. To be specific, the closer to the position O, the larger the pixel gaps are, the more the number and area of the at least one light transmissive region 21 are; the closer to the boundary line C, the smaller the pixel gaps are, and the less the number and area of the at least one light transmissive region 21 are.

Figure 3:
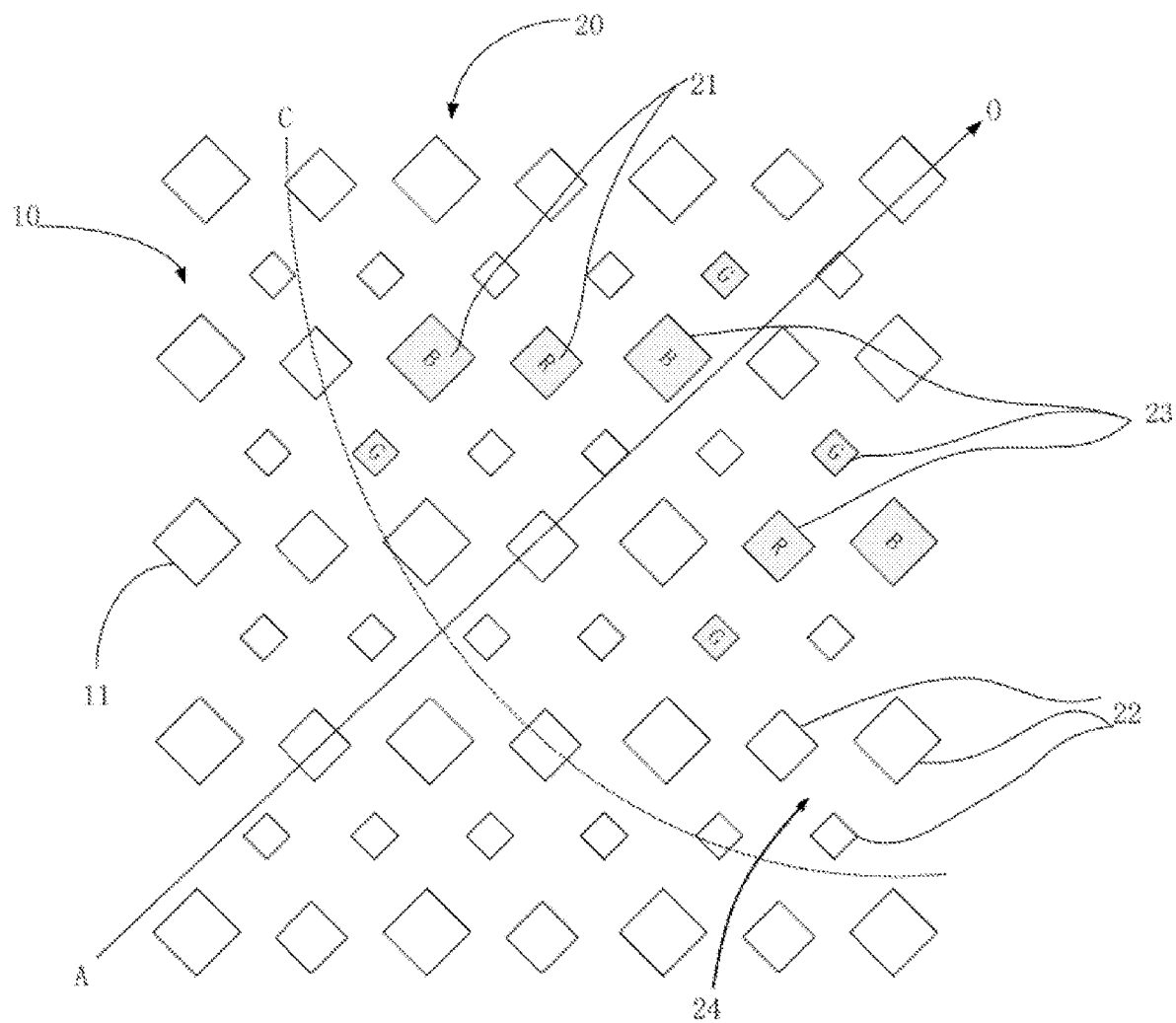
FIG. 3 is another schematic view illustrating distribution of the pixel region and the display region in the OLED display panel according to one embodiment of the present invention.

Referring to FIG. 3, according to another embodiment, in the direction A toward the center of the pixel region 20, an area of the sub-pixels 22 remains unchanged, but a number of the sub-pixels 22 are gradually decreased, so that the pixel density of the sub-pixels 22 is gradually decreased. Specifically, in the direction A, the number of the sub-pixels 22 near the position O are less than the number of the sub-pixels 22 near the boundary line C. Further, as shown in FIG. 3, at least one sub-pixel region 23 is disposed in the pixel region 20, and a number of the at least one sub-pixel region 23 is the same as the number of the at least one light transmissive region 21, so that the at least one light transmissive region 21 can be correspondingly disposed in the at least one sub-pixel region 23. It should be noted that the at least one sub-pixel region 23 is originally provided with the sub-pixels 22. By arranging the at least one light transmissive region 21 in the at least one sub-pixel region 23, the sub-pixels 22 in the at least one sub-pixel region 23 are removed. For example, nine sub-pixel regions 23 in FIG. 3 are originally filled with three green sub-pixels G, three blue sub-pixels B, and two red sub-pixels R. By arranging the light transmissive regions 21 in the nine sub-pixel regions, the nine sub-pixels are removed. The number of the sub-pixels 22 in the pixel region 20 is decreased, so that the pixel density of the sub-pixels 22 in the pixel region 20 is less than the pixel density of the sub-pixels 11 in the display region 10.

In the direction A toward the center of the pixel region 20, the number of the at least one sub-pixel region 23 is gradually increased, and the number of the at least one light transmissive region 21 is gradually increased. Specifically, in the direction A, the area of the sub-pixels 22 remains unchanged, and the number of the at least one sub-pixel region 23 in which the at least one light transmissive region is disposed is gradually increased, so that the number of the at least one light transmissive region 21 also changes gradually. That is, the closer to the position O, the more is the number of the at least one sub-pixel region 23 in which the at least one light transmissive region 21 is disposed, and the more is the number of the at least one light transmissive region 21. The closer to the boundary line C, the smaller is the number of the at least one sub-pixel region 23 in which the at least one light transmissive region 21 is disposed, and the less is the number of the at least one light transmissive region 21.

Figure 4:
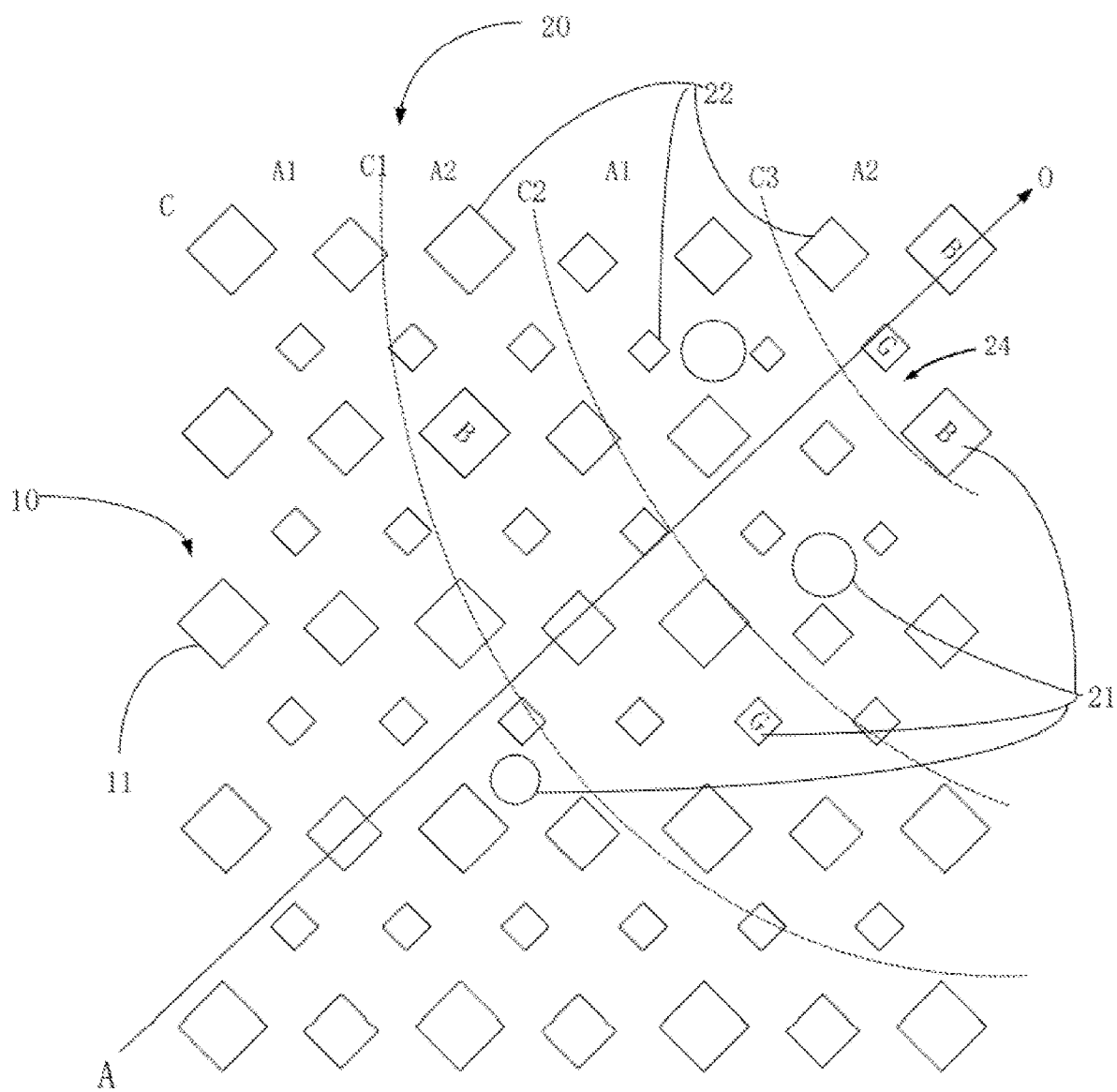
FIG. 4 is still another schematic view illustrating distribution of the pixel region and the display region in the OLED display panel according to one embodiment of the present invention.

Referring to FIG. 4, according to still another embodiment, in the direction A toward the center of the pixel region 20, the area and the number of the sub-pixels 22 are alternately decreased, so that the pixel density of the sub-pixels 22 is gradually decreased. Specifically, the pixel region 20 is divided into at least one first region and at least one second region, and in the direction A toward the center of the pixel region 20, the at least one first region and the at least one second region are alternately disposed. As shown in FIG. 4, the pixel region 20 is divided into two first regions and two second regions, and a region between the boundary line C and a virtual line C1 is a first region, a region between the virtual line C1 and a virtual line C2 is a second region, a region between the virtual line C2 and a virtual line C3 is a first region, and a region between the virtual line C3 and the position O is a second region.

Further, in the direction A toward the center of the pixel region 20, the area of the sub-pixels in the at least one first region is gradually decreased, and the number of the sub-pixels in the at least one second region is gradually decreased.

Specifically, in the direction A, the number of the sub-pixels 22 in the at least one first region remains unchanged, but the area of the sub-pixels 22 is gradually decreased. For example, the area of the sub-pixels 22 in the first region between the virtual line C2 and the virtual line C3 is less than the area of the sub-pixels 22 in the first region between the boundary line C and the virtual line C1. Further, a pixel gap is defined between each two adjacent sub-pixels 22 in the at least one first region, and the at least one light transmissive region 21 is defined in the pixel gaps. Along the direction A toward the center of the pixel region 20, the size of the pixel gaps is gradually increased, and the number and area of the at least one light transmissive region 21 are gradually increased. For example, the size of the pixel gaps and the number and area of the at least one light transmissive region 21 in the first region between the virtual line C2 and the virtual line C3 are respectively less than the size of the pixel gaps and the number and area of the light transmissive regions 21 in the first region between the boundary line C and the virtual line C1.

Specifically, in the direction A, the area of the sub-pixels 22 in the second region remains unchanged, but the number of the sub-pixels 22 is gradually decreased. For example, the number of the sub-pixels in the second region between the virtual line C3 and the position O is less than the number of the sub-pixels in the second region between the virtual line C1 and the virtual line C2. Further, at least one sub-pixel region is disposed in the at least one second region, and the number of the at least one sub-pixel region is the same as the number of the at least one light transmissive region 21, so that the at least one light transmissive region 21 can be correspondingly disposed in the at least one sub-pixel region. In the direction A, the number of the at least one sub-pixel region is gradually increased, and the number of the at least one light transmissive region 21 is gradually increased. For example, the number of the at least one sub-pixel region and the number of the at least one light transmissive region 21 in the second region between the virtual line C3 and the position O are respectively less than the number of the at least one sub-pixel region and the number of the at least one light transmissive region 21 in the second region between the virtual line C1 and the virtual line C2.

In the OLED display panel of the present embodiment, after the at least one light transmissive region is disposed in the pixel region, the pixel density of the sub-pixels arranged in the pixel region is gradually decreased in a direction toward the center of the pixel region, thereby avoiding an abrupt change in the pixel density of the pixel region, thus avoiding a great difference in luminous efficiency between the pixel region and the display region, accordingly reducing a visual difference between the pixel region and the display region.

Figure 5:
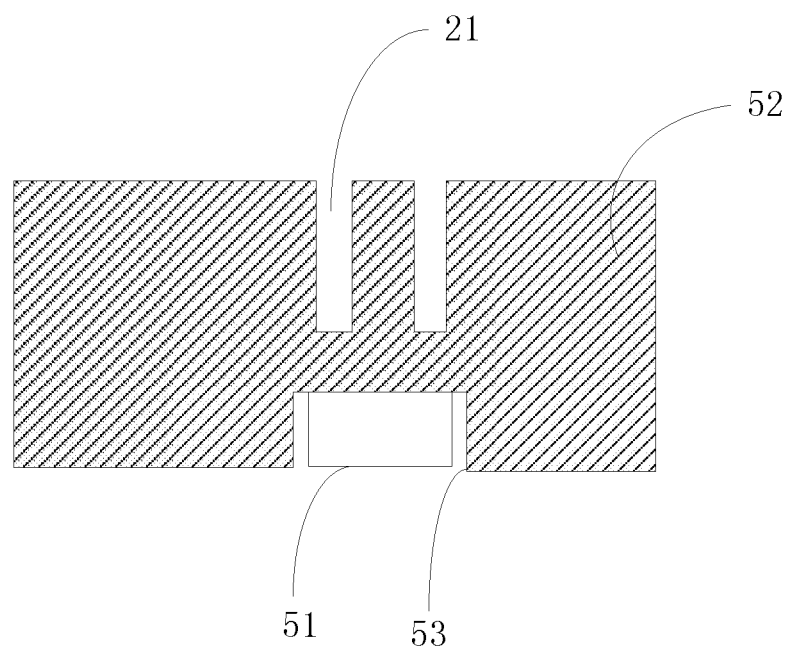
FIG. 5 is a schematic structural view illustrating an intelligent terminal according to one embodiment of the present invention.

FIG. 5 is a schematic structural view of an intelligent terminal according to one embodiment of the present invention. The intelligent terminal includes a plurality of sensor elements 51 and an organic light emitting diode (OLED) display panel 52. The OLED display panel 52 is the OLED display panel in the above-mentioned embodiment, so a detailed description thereof is not repeated for brevity.

The sensor elements 51 are disposed in an electronic element region 53 on a back side of the OLED display panel 52. The electronic element region 53 can be a recess on a back side of the OLED display panel 52. In other words, the sensor elements 51 are disposed in the recess on the back side of the OLED display panel 52. The electronic element region 53 is arranged corresponding to the at least one light transmissive region 21 in the pixel region, so that the sensor elements 51 are disposed corresponding to the at least one light transmissive region 21. The sensor elements 51 can be sensor units of a camera.

In the intelligent terminal of the present embodiment, the pixel density of the sub-pixels arranged in the pixel region is gradually decreased in the direction toward the center of the pixel region after the at least one light transmissive region is disposed in the pixel region, thereby avoiding an abrupt change in the pixel density of the pixel region, thus avoiding a great difference in luminous efficiency between the pixel region and the display region, accordingly reducing a visual difference between the pixel region and the display region.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. An organic light emitting diode (OLED) display panel, comprising:
   an electronic element region in which a plurality of sensor elements are disposed; and
   a pixel region provided with at least one light transmissive region, the electronic element region being arranged corresponding to the at least one light transmissive region, a plurality of sub-pixels being arranged in the pixel region, a density of the sub-pixels being gradually decreased along a direction toward a center of the pixel region;
   wherein an area of the sub-pixels is gradually reduced along the direction toward the center of the pixel region, so that the density of the sub-pixels is gradually decreased; and
   wherein a pixel gap is defined between each two adjacent sub-pixels, and the at least one light transmissive region is defined in the pixel gaps, and wherein along the direction toward the center of the pixel region, a size of the pixel gaps is gradually increased, and a number and an area of the at least one light transmissive region are gradually increased.

2. The OLED display panel according to claim 1, wherein a number of the sub-pixels is gradually decreased along the direction toward the center of the pixel region, so that the density of the sub-pixels is gradually decreased.

3. The OLED display panel according to claim 2, wherein the pixel region is further provided with at least one sub-pixel region, and the at least one light transmissive region is defined in the at least one sub-pixel region, and wherein along the direction toward the center of the pixel region, a number of the at least one sub-pixel region is gradually increased, and a number of the at least one light transmissive region is gradually increased.

4. The OLED display panel according to claim 1, wherein an area and a number of the sub-pixels are alternately decreased along the direction toward the center of the pixel region, so that the density of the sub-pixels is gradually decreased.

5. The OLED display panel according to claim 4, wherein the pixel region is divided into at least one first region and at least one second region, wherein along the direction toward the center of the pixel region, the at least one first region and the at least one second region are alternately disposed, an area of the sub-pixels in the at least one first region is gradually decreased, and a number of the sub-pixels in the at least one second region is gradually decreased.

6. The OLED display panel according to claim 5, wherein a pixel gap is defined between each two adjacent sub-pixels in the at least one first region, and the at least one light transmissive region is defined in the pixel gaps, and wherein along the direction toward the center of the pixel region, a size of the pixel gaps in the at least one first region is gradually increased, and a number and an area of the at least one light transmissive region in the at least one first region are gradually increased.

7. The OLED display panel according to claim 5, wherein the at least one second region is provided with at least one sub-pixel region, and the at least one light transmissive region in the at least one second region is defined in the at least one sub-pixel region, and wherein along the direction toward the center of the pixel region, a number of the at least one sub-pixel region in the at least one second region is gradually increased, and a number of the at least one light transmissive region is gradually increased.

8. The OLED display panel according to claim 1, wherein the OLED display panel further comprises a display region disposed outside the pixel region, a plurality of sub-pixels are arranged in the display region, and the density of the sub-pixels in the display region is greater than the density of the sub-pixels in the pixel region.

9. An intelligent terminal, comprising a plurality of sensor elements and an organic light emitting diode (OLED) display panel, the OLED display panel comprising:
an electronic element region; and
a pixel region comprising at least one light transmissive region, the electronic element region being arranged corresponding to the at least one light transmissive region, the sensor elements being disposed in the electronic element region, a plurality of sub-pixels being arranged in the pixel region, a density of the sub-pixels being gradually decreased along a direction toward a center of the pixel region;
wherein an area of the sub-pixels is gradually reduced along the direction toward the center of the pixel region, so that the density of the sub-pixels is gradually decreased; and
wherein a pixel gap is defined between each two adjacent sub-pixels, and the at least one light transmissive region is defined in the pixel gaps, and wherein along the direction toward the center of the pixel region, a size of the pixel gaps is gradually increased, and a number and an area of the at least one light transmissive region are gradually increased.

10. The intelligent terminal according to claim 9, wherein a number of the sub-pixels is gradually decreased along the direction toward the center of the pixel region, so that the density of the sub-pixels is gradually decreased.

11. The intelligent terminal according to claim 10, wherein the pixel region is further provided with at least one sub-pixel region, and the at least one light transmissive region is defined in the at least one sub-pixel region, and wherein along the direction toward the center of the pixel region, a number of the at least one sub-pixel region is gradually increased, and a number of the at least one light transmissive region is gradually increased.

12. The intelligent terminal according to claim 9, wherein an area and a number of the sub-pixels are alternately decreased along the direction toward the center of the pixel region, so that the density of the sub-pixels is gradually decreased.

13. The intelligent terminal according to claim 12, wherein the pixel region is divided into at least one first region and at least one second region, wherein along the direction toward the center of the pixel region, the at least one first region and the at least one second region are alternately disposed, an area of the sub-pixels in the at least one first region is gradually decreased, and a number of the sub-pixels in the at least one second region is gradually decreased.

14. The intelligent terminal according to claim 13, wherein a pixel gap is defined between each two adjacent sub-pixels in the at least one first region, and the at least one light transmissive region in the at least one first region is defined in the pixel gaps, and wherein along the direction toward the center of the pixel region, a size of the pixel gaps in the at least one first region is gradually increased, and a number and an area of the at least one light transmissive region in the at least one first region are gradually increased.

15. The intelligent terminal according to claim 13, wherein the at least one second region is provided with at least one sub-pixel region, and the at least one light transmissive region in the at least one second region is defined in the at least one sub-pixel region, and wherein along the direction toward the center of the pixel region, a number of the at least one sub-pixel region in the at least one second region is gradually increased, and a number of the at least one light transmissive region is gradually increased.

16. The intelligent terminal according to claim 9, wherein the OLED display panel further comprises a display region disposed outside the pixel region, a plurality of sub-pixels are arranged in the display region, and the density of the sub-pixels in the display region is greater than the density of the sub-pixels in the pixel region.

* * * * *